(12) United States Patent
Heckeroth (10) Patent No.: US 7,365,266 B2
(45) Date of Patent: *Apr. 29, 2008

(54) METHOD AND SYSTEM FOR MOUNTING PHOTOVOLTAIC MATERIAL

(75) Inventor: Steve Heckeroth, Albion, CA (US)

(73) Assignee: United Solar Ovonic LLC, Auburn Hills, MI (US)

( * ) Notice: Subject to any disclaimer, the term of this patent is extended or adjusted under 35 U.S.C. 154(b) by 754 days.

This patent is subject to a terminal disclaimer.

(21) Appl. No.: 10/716,995

(22) Filed: Nov. 19, 2003

(65) Prior Publication Data

US 2004/0173255 A1 Sep. 9, 2004

Related U.S. Application Data

(63) Continuation-in-part of application No. 10/095,391, filed on Mar. 12, 2002, now Pat. No. 6,730,841.

(51) Int. Cl.
*H01L 31/048* (2006.01)
*H01L 31/042* (2006.01)

(52) U.S. Cl. ............ 136/251; 136/244; 136/291; 52/173.3; 52/469; 156/71; 156/577; 257/433; 438/64

(58) Field of Classification Search ........... 156/577, 156/71; 136/251, 291, 244; 52/173.3, 469; 257/433; 438/64

See application file for complete search history.

(56) References Cited

U.S. PATENT DOCUMENTS

| | | | | |
|---|---|---|---|---|
| 3,992,847 A | * | 11/1976 | Heath | 52/742.12 |
| 4,546,586 A | * | 10/1985 | Knudson | 52/469 |
| 4,674,244 A | * | 6/1987 | Francovitch | 52/173.3 |
| 5,092,939 A | * | 3/1992 | Nath et al. | 136/251 |

* cited by examiner

*Primary Examiner*—Nam Nguyen
*Assistant Examiner*—Thanh-Truc Trinh
(74) *Attorney, Agent, or Firm*—Frederick A. Krieger

(57) ABSTRACT

The present invention discloses a system and method for mounting a flexible material, such as a web of photovoltaic material, onto a surface, such as a roof. The system and method comprises providing a first and a second elongated web of flexible material and disposing the first and second webs on the surface in a longitudinally aligned relationship with one another, wherein a first edge of said first web abuts a first edge of said second web to form a longitudinal engagement point to produce a substantially triangular shape. At least one clamping strip is secured onto the longitudinal engagement point, wherein the clamping strip(s) is adapted to secure the longitudinal engagement point in a stable position for the length of the web. At least one batten cap is clamped onto the clamping strip(s), wherein the batten cap(s) is adapted to secure the clamping strips. Additionally, securing means, such as screws, nails or adhesives, may be incorporated to attach the sides of the substantially triangular shape to the surface.

25 Claims, 10 Drawing Sheets

METHOD AND SYSTEM FOR MOUNTING PHOTOVOLTAIC MATERIAL

RELATED APPLICATION DATA

The present application is filed under 35 USC § 1.53(b) as a Continuation-in-Part of U.S. patent application Ser. No. 10/095,391, filed on Mar. 12, 2002 now U.S. Pat. No. 6,730,841, which is hereby incorporated herein by reference.

FIELD OF THE INVENTION

The present invention discloses a system and method for securing flexible photovoltaic material onto a surface. More specifically, the invention relates to roof-mounted photovoltaic generating structures and methods for mounting flexible, photovoltaic roofing material onto a roof or deck structure which limits the use of adhesives to secure the material.

BACKGROUND OF THE INVENTION

Photovoltaic devices provide silent, nonpolluting, reliable sources of electrical energy. Rooftops and other portions of building structures provide ideal support surfaces for photovoltaic devices, and a large body of art has been developed relating to methods and apparatus for mounting photovoltaic structures onto buildings.

Thin film photovoltaic devices are particularly advantageous since they are relatively low in cost, flexible, and capable of being manufactured in relatively large areas, by continuous deposition processes. Such thin film devices can be encapsulated in transparent, durable, flexible polymeric bodies, and are ideally suited for building-mounted installations. In some instances, roofing materials can actually be fabricated from webs of photovoltaic material. Such configurations can function as a roofing material and can also provide large amounts of electrical power.

A first example of a photovoltaic array module incorporating a plurality of photovoltaic cell strips is set forth in U.S. Pat. No. 4,574,160, issued to Cull et al. Each cell strip incorporates an electrically conductive substrate layer, a semiconductor body deposited on the substrate layer, and a transparent electrically conductive layer deposited on the semiconductor body. Electrically conductive filaments are alternately connected to contact points on the substrate layer of one cell strip and to contact points on the transparent electrically conductive layer of another cell strip. First and second bus bars are connected to the end of the cell strips of the array to collect the electrical energy created thereby. However, each cell strip must be interconnected to the next and various interconnections do not incorporate batten caps.

A further example of the prior art is set forth in U.S. Pat. No. 6,148,570 issued to Dinwoodie et al., which discloses a photovoltaic building assembly that includes a building support surface on which a PV module support assembly is mounted. The support assembly includes a base secured to the support surface, and an upper portion. A PV module is mounted to and is supported by the body of the upper portion. A foam insulation layer is sprayed onto the support surface to embed the base and lower ends of the legs therein. A weather-resistant layer is applied to the outer surface of the insulation layer to prevent moisture from reaching the building surface. The base can be secured to the building support surface by an adhesive or by mechanical fasteners as well as by simply embedding the base within the insulation layer. The assembly provides for electricity generation, building thermal insulation and building waterproofing in a lightweight construction assembly. However, the mounting system is very complex and requires labor intensive installation.

Consequently, there exists a need in the art for a method and system for mounting photovoltaic material that securely fastens individual photovoltaic strips or panels to a surface, such as a roof deck, while limiting the use of adhesive materials and labor intensive steps. Further, there is a need for a system and method that provides an easy and simple way the securely fasten photovoltaic strips.

SUMMARY OF THE INVENTION

The present invention discloses a method of mounting a flexible material, such as a web of photovoltaic material, onto a surface, such as a roof. The method comprises providing a first and a second elongated web of flexible material and disposing the first and second webs on the surface in a longitudinally aligned relationship with one another, wherein a first edge of said first web abuts a first edge of said second web to form a longitudinal engagement point. At least one clamping strip is secured onto the longitudinal engagement point, wherein the clamping strip(s) is adapted to secure the longitudinal engagement point in a stable position for the length of the web. At least one batten cap is clamped onto the clamping strip(s), wherein the batten cap(s) is adapted to secure the clamping strips.

A membrane material may be disposed onto the roof deck before the webs are set onto the roof. Then, the webs of photovoltaic material are set onto the membrane material. Other steps may include establishing electrical communication to each of said webs of photovoltaic roofing material; establishing electrical communication in a region of a soffit of the roof; establishing electrical connection in a region of a ridge of the roof; and establishing electrical communication proximate a transverse extending edge of each of said webs of photovoltaic material.

The longitudinal engagement point may form a substantially triangular shape having the surface as a base, the first edge of the first web as a first side and the first edge of the second web as a second side. The batten cap may be fabricated with inwardly curled ends that correspond in shape to the respective sides of the substantially triangular shape that forms the engagement point.

The present invention discloses a system for securing webs of flexible photovoltaic material to a surface, such as a roof deck. A first flexible web of photovoltaic material and a second web of photovoltaic material are set onto the surface in a longitudinally aligned relationship with one another, wherein a first edge of the first web abuts a first edge of the second web to form a longitudinal engagement point. At least one clamping strip is clamped onto the longitudinal engagement point and at least one batten cap clamped onto the clamping strip(s). Each of said webs have a generally central photovoltaic area encapsulated within a polymeric material and the polymeric material may have both side and end extending edges beyond the photovoltaic area and a pair of contact terminals extending from a selected end of the flexible web and establishing electrical communication with the photovoltaic area. The photovoltaic web may maintain a uniform thickness through the entire area of the web or, preferably, may maintain a uniform thickness throughout cross sections having the photovoltaic area, then taper to a thinner thickness at the edges and sides.

The longitudinal engagement point may form a substantially triangular shape having the surface, such as a roof top, as a base, the first edge of the first web as a first side and the first edge of the second web as a second side. The first side and the second side may have an arced shape due to the flexibility of the material. The batten cap(s) may have sides with inwardly curled ends. The arced shape of the first and second sides may maintain contact with the inwardly curled ends of the batten cap(s). The system may further include means for securing the sides of the substantially triangular shape to the surface.

An embodiment of current application discloses a ridge roller for installing strips of photovoltaic material. The ridge roller rotatably secures a spool of photovoltaic material to facilitate the drawing and sectioning of discreet lengths of photovoltaic material for installation in the manner described above. In one embodiment, the ridge roller comprises a first set of legs adapted to run along a first rail and a second set of legs adapted to run along a second rail. Preferably, the second rail is approximately parallel to said first rail to maintain a smooth transfer as the ridge roller is moved along the ridge and the strips are drawn and sectioned. A cradle is adapted to rotatably support the spool. In another embodiment, the ridge roller comprises a box structure having a first sliding panel and a second sliding panel. The sliding panels are adjusted to allow the ridge roller to run along the ridge without tacks. However, tracks may be added to secure the position of the ridge roller. Wheels are attached to the sliding panels to assist in movement along the ridge. Preferably, at least one first locking means is adapted to lock the first sliding panel into a desired position and at least one second locking means adapted to lock said second sliding panel into a desired position.

An embodiment of the present invention provides a method of installing photovoltaic roofing material to the roof of residential or commercial buildings.

An embodiment of the present invention provides a system for securing flexible photovoltaic roofing material to a roof deck that limits or eliminates the use of adhesives.

An embodiment of the present invention provides a system for securing abutting webs of flexible photovoltaic material to a surface that incorporates a clamping strip to maintain an engagement point between the abutting webs and a batten cap to secure the position of the clamping strip.

An embodiment of the present invention provides an improved system and method for securing a series of proximately set webs of photovoltaic material onto a surface, such as a roof deck.

An embodiment of the present invention provides an apparatus for transporting and distributing a roll of photovoltaic material, wherein the shipping container for the material also may be positioned atop a roof to the secure the roll during installation of the photovoltaic material.

An embodiment of the present invention provides an apparatus for mounting a spool of photovoltaic strips onto a roof ridge for installation upon a roof.

BRIEF DESCRIPTION OF THE DRAWINGS

In order to assist in the understanding of the various aspects of the present invention and various embodiments thereof, reference is now be made to the appended drawings, in which like reference numerals refer to like elements. The drawings are exemplary only, and should not be construed as limiting the invention.

DETAILED DESCRIPTION OF THE INVENTION

Figure 3A:
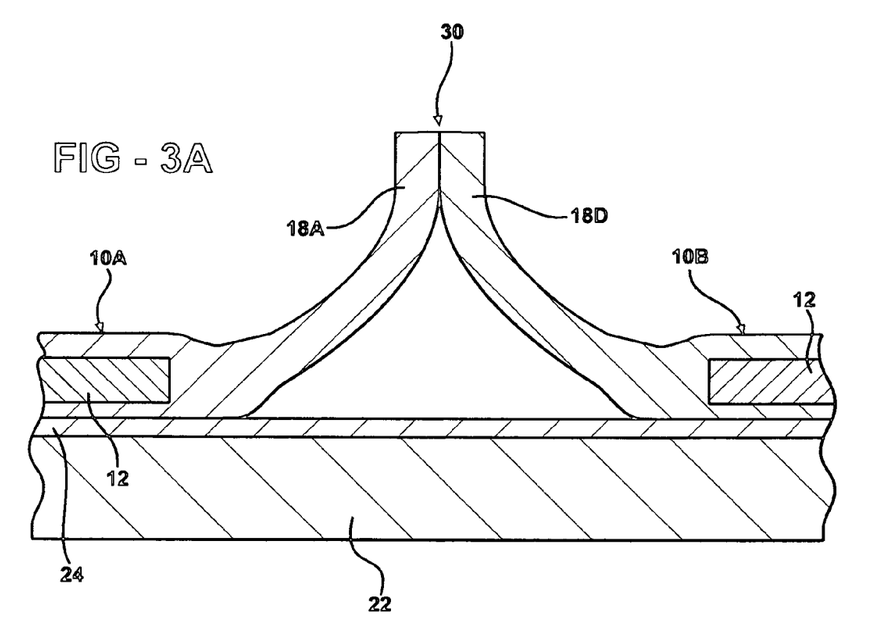
FIG. 3A is an angled view of a step in an embodiment of one of the mounting methods of the present invention and in which first and second webs of photovoltaic material are disposed longitudinally to form a substantially triangular shape that forms an engagement point from sides of the substantially triangular shape.

The present invention discloses a system and method for securing flexible panels, such as a photovoltaic roofing material, to a surface, such as a roof. Referring to FIG. 3A, a cross-sectional view is illustrated of a roof deck 22 showing a first stage in the mounting of two strips 10A and 10B of photovoltaic roofing material onto the roof deck 22. As is shown in this embodiment, a sheet of membrane material 24 may be disposed atop a roof deck 22, the strips of photovoltaic material 10A and 10B being disposed onto.

Figure 1:
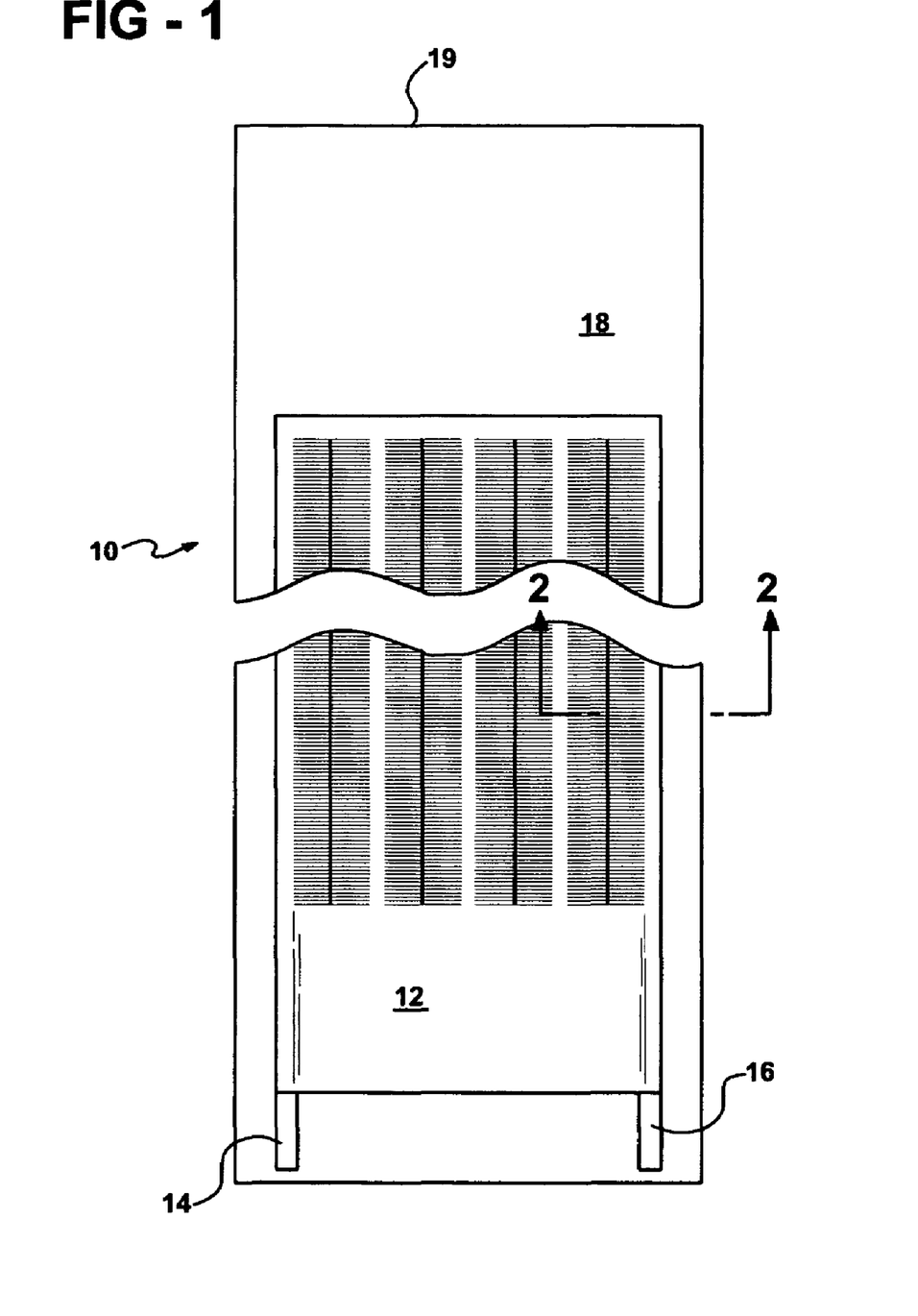
FIG. 1 is a schematic depiction of a web of photovoltaic roofing material, which is a type of flexible material that may be utilized in the practice of the present invention.

The membrane material 24 may be selected from materials including but not limited to tarpaper, polymeric material and natural rubber. Referring now to FIG. 1, a schematic depiction is illustrated at of a web of photovoltaic material 10 that may be used with the present invention. The invention disclosed herein is particularly useful in securing large areas of photovoltaic webs. The present invention discloses a system and method for mounting photovoltaic roofing material onto building structures such as a peaked roof. As is known in the art, such photovoltaic roofing materials are capable of absorbing solar ambient light for conversion into a suitable electrical output and for use with other known electrical components such as junction boxes and the like.

Referring again to FIG. 1, an exemplary photovoltaic roofing material 10 is provided and which is preferably established in a thin, flexible and substantially elongated configuration, such as flattened and lengthwise extending strips. However, the shape of the photovoltaic material is not limited to any specific configuration. Further, the batten system of the present invention may be incorporated into photovoltaic roofing material having shapes other than the elongated shape illustrated in FIG. 1. The roofing material includes a photovoltaically active area 12, preferably constructed as a flexible, thin film photovoltaic device. Photovoltaic devices generally include a body of substrate electrode material having a number of layers of thin film semiconductor material deposited thereupon as generally described in U.S. Pat. No. 6,468,829 issued to Guha et al. on Oct. 22, 2002 and U.S. Pat. No. 5,977,476 issued to Guha et al. on Nov. 2, 1999, which are hereby incorporated herein by reference.

In an exemplary photovoltaic strip, contact terminals 14 and 16 extend from a selected elongate extending end of the photovoltaic area 12 and establish electrical communication with the device, as illustrated in FIG. 1. The terminals may be connected to a junction box or other such connector device.

The electrode material of the photovoltaic area 12 is encapsulated within a body of polymeric material 18, which likewise exhibits a thin and generally elongated shape so that it extends a selected distance beyond the elongate extending sides of the photovoltaic area 12, in order to ensure a good environmental seal between the polymeric material 18 and the photovoltaic area 12. In addition, the polymeric material 18 extends a greater distance beyond the opposite extending ends of the photovoltaic area 12, particularly the top end, and which allows for the body of roofing material 10 to be cut to accommodate various roof shapes. The polymeric material is resistant to ambient conditions and further includes a top surface transparent to photovoltaically active wavelengths.

Figure 2A:
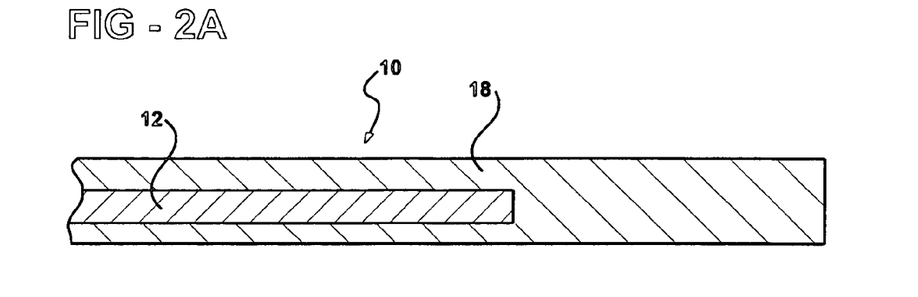
FIG. 2A is a cross-sectional view of the body of photovoltaic material of FIG. 1A taken along line 2-2 and illustrating a uniform thickness to the edge.
Figure 2B:
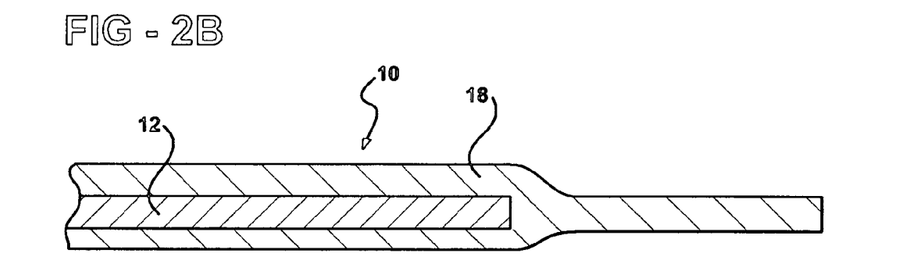
FIG. 2B is a cross sectional view of the body of photovoltaic material of FIG. 1A taken along line 2-2 and illustrating a tapering of the polymeric material to the edge.

Referring now to FIG. 2A, a cross-sectional view of the body of photovoltaic roofing material 10 of FIG. 1 is illustrated along line 2-2. As shown in further detail, the body of photovoltaic material again illustrates the photovoltaic area 12 embedded within the body of encapsulating material 18, which in some preferred instances is a fluoropolymer. As illustrated in FIG. 2B, the body of polymeric material 18 may be tapered toward the edges and sides for ease of bending, which is preferred as explained below. Preferably, the body of polymeric material 18 is tapered at a point beyond the photovoltaic area 12.

Figure 3B:
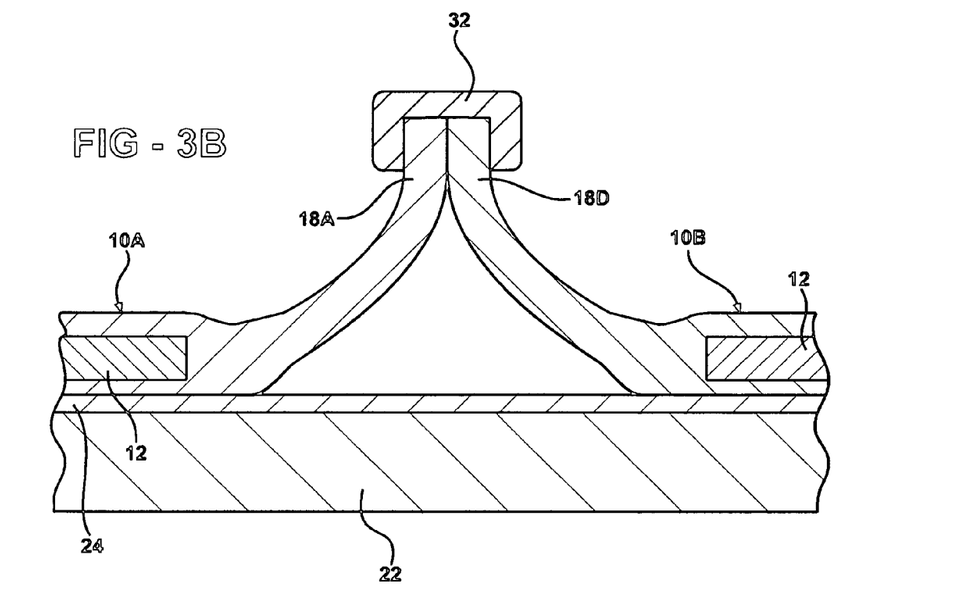
FIG. 3B is a cross sectional view of a step in the mounting method of the present invention in which a clamping strip is disposed onto the engagement point.

Referring now to FIG. 3A, a cross-sectional view is illustrated of a roof deck 22 and showing a first stage in the mounting of two strips of photovoltaic roofing material 10A and 10B. The engagement point 30 of the two strips is formed from the extended body of polymeric material 18A and 18B. Each of the photovoltaic strips 10A and 10B may be similar in configuration and construction to that described at and in reference to FIGS. 1, 2A and 2B. Preferably, enough material is provided to produce an engagement point 30 that may be secured by a clamping strip 32 set onto the engagement point, as described below. The photovoltaic strips 10A and 10B may be cut to engage one another to form a somewhat triangular space between the membrane material and the strips, as illustrated in FIGS. 3A, 3B and 3D.

Figure 6:
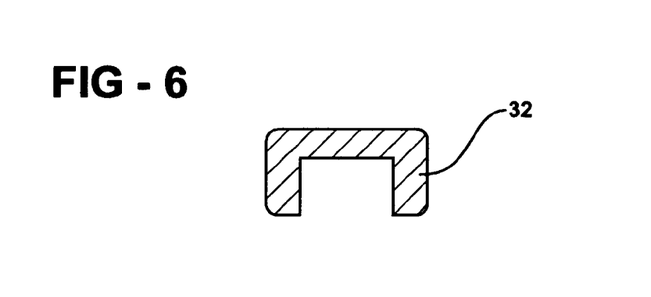
FIG. 6 is a cross sectional view of a clamping strip that may be used with the present invention.

An elongated clamping strip 32 may be set to secure the position of the engagement point 30 of photovoltaic strips 10A and 10B. A cross sectional view of a preferred clamping strip 32 is illustrated in FIG. 6. Preferably, the clamping strip 32 is approximately equal to the longitudinal length of the engagement point. The clamping strip 32 is illustrated in cross-sectional cutaway and is understood to extend in a desired lengthwise manner, such as corresponding to the overall length of strips of photovoltaic material 10A and 10B. The clamping strip 32 is preferably U-shaped as illustrated in FIG. 6.

However, a C-shape or other modified form may be incorporated to achieve the desired result of securing the engagement point 30 of the photovoltaic strips 10A and 10B. Additionally, the clamping strip 32 may be designed with a closed end, as opposed to the open end illustrated in FIG. 3B, however, the closed end embodiment requires that the clamping strip be longer than the longitudinal length of the engagement point. In an alternative embodiment, a plurality of clamping strips 32 may be incorporated along the length of the engagement point 30.

Figure 3C:
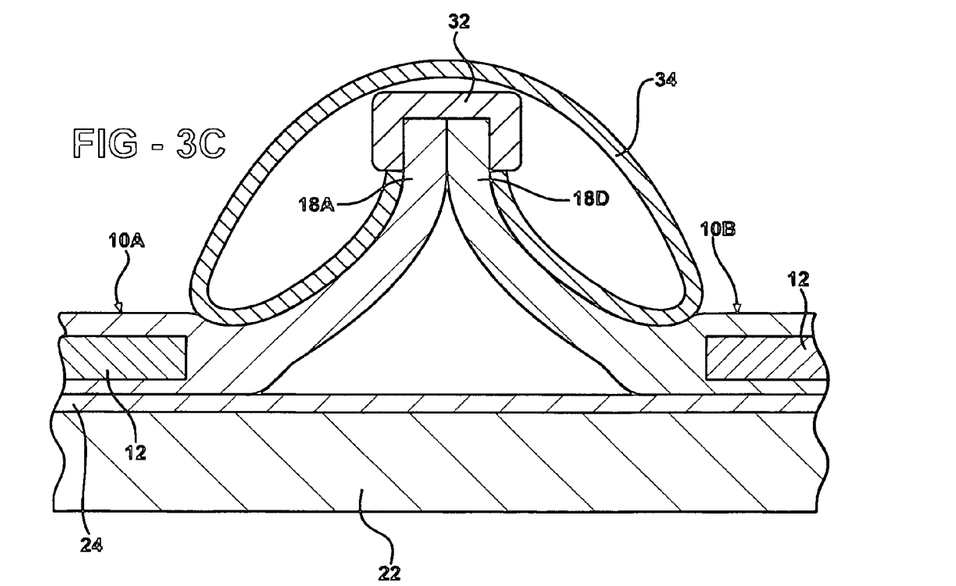
FIG. 3C is a cross sectional view of embodiment of a step in the mounting method of the present invention and in which a plurality of clamping strips are disposed onto the engagement point.
Figure 3D:
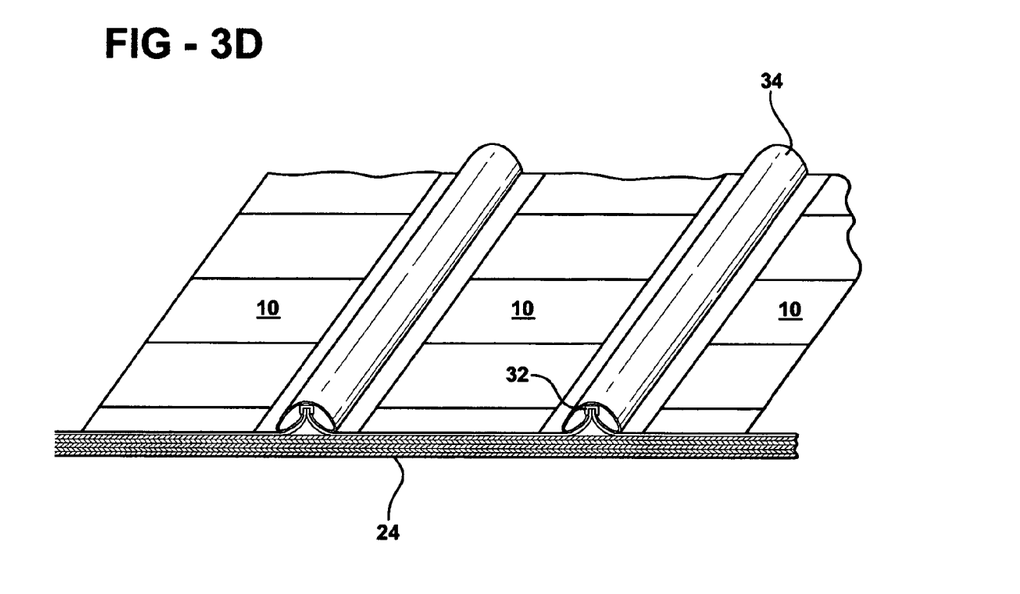
FIG. 3D is a perspective view of a portion of a roof having photovoltaic strips secured together in accordance with an embodiment of the present invention.

Referring to FIG. 3D, a batten cap 34 may be fitted onto the clamping strip 32 in the manner illustrated. As with the clamping strip 32, the batten cap 34 is constructed as a lengthwise extending component and preferably exhibits material and performance characteristics similar to that of the clamping strip 32.

The batten cap 34 preferably incorporates opposite and inwardly curled ends, as illustrated. The curled ends of the batten cap 34 preferably engage the extended ends of each clamping strip 32, as illustrated in FIG. 3C. Most preferably, the space between the apex of the batten cap 34 and the tips of the inwardly curled ends of the batten cap 34 are shaped to tightly engage the shape of the clamping strip 32, as illustrated in FIG. 3C. The respective sides of the batten cap 34 may exhibit an arcuate configuration, as illustrated in the cross-sectional cutaway of FIG. 3C. Preferably, the arcuate shape is substantially similar to the two arcuate sides of the somewhat triangular shape produced by the engaging photovoltaic strips 10A and 10B. In an alternative embodiment, an affixing mechanism, such as a low profile screw, may be applied to the base area where the photovoltaic strips contact the roof. Other affixing mechanisms may be used, including but not limited to nails or adhesion materials. FIG. 3D illustrates batten caps and clamping strips securing the engagement points of several adjoining photovoltaic strips in a perspective view of a roof deck. In an alternative embodiment, more than one batten cap may be set over the clamping strip(s) and engagement points.

Figure 4:
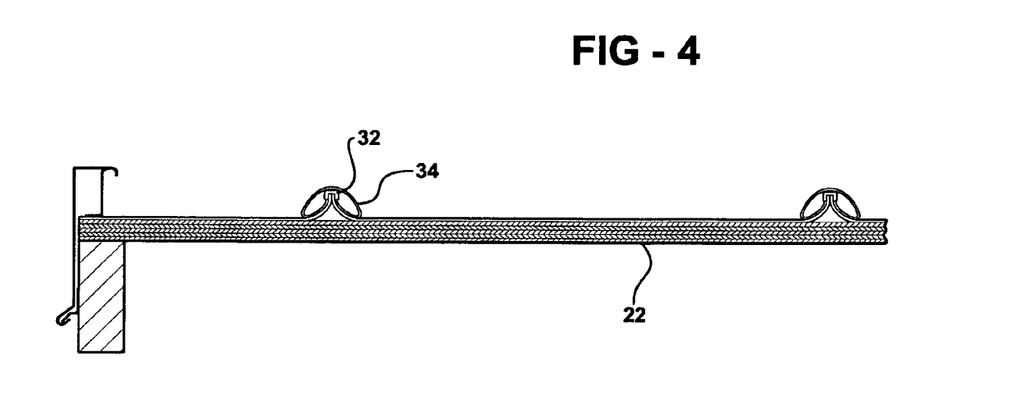
FIG. 4 is a depiction of portions of the device being secured with clamping strips and batten caps according to the present invention.

FIG. 4 illustrates a series of clamping strips 32 and batten caps 34 securing a plurality of succeeding photovoltaic strips on a surface, such as a roof top. The present invention disclosed may be configured of multitude of shapes and sizes and applications of the present invention should not be limited to the configuration of photovoltaic device 10 of FIG. 1, which is used for descriptive purposes.

Figure 11A:
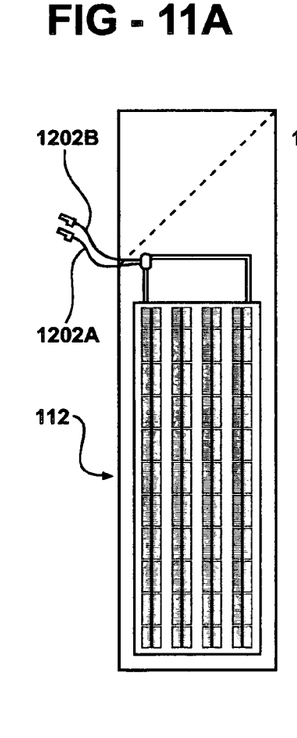
FIG. 11A is an illustration of a web panel having a line cut along A-A to form one web panel that may be secured on the side of a ridge.
Figure 11B:
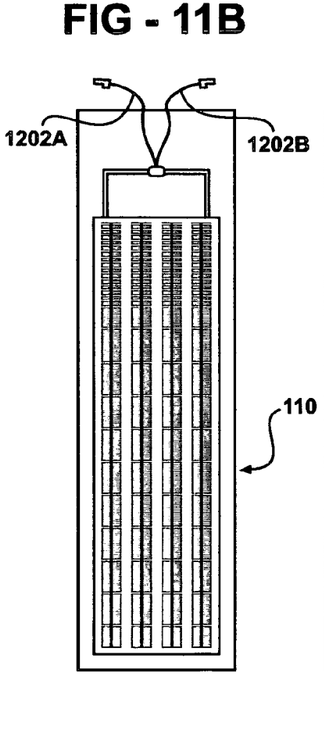
FIG. 11B is an illustration of a web panel having a rectangular shape.
Figure 11C:
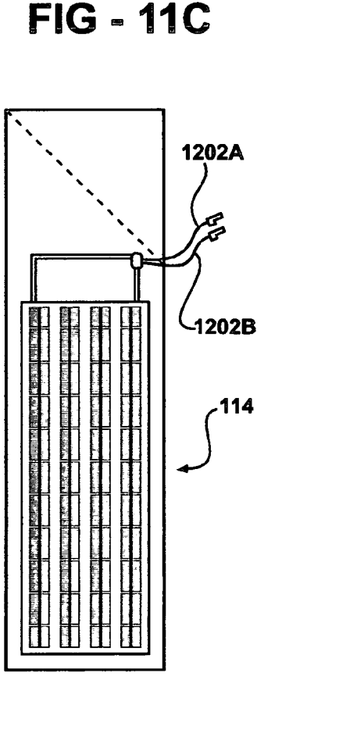
FIG. 11C is an illustration of a web panel having a line cut along C-C to form one web panel that may be secured on the side of a ridge opposite the side of FIG. 11A.

Referring to FIGS. 11A through 11C, some examples of varying shapes are illustrated. For mid roof application, a rectangular shape 110 is appropriate as the end forms one side of the engagement point, as illustrated in FIG. 11B. However, the photovoltaic strips need to adapt to varying surfaces as a result of obstacles, such as windows, sides and doors. FIG. 11A illustrates a photovoltaic strip 112 cut along line A-A to produce a photovoltaic strip 112 that may be secured to a ridge and produce one side of an engagement point. Cutting along line C-C of FIG. 11C to produce a photovoltaic strip 114 having the necessary shape produces the other side of the engagement point.

Figure 11D:
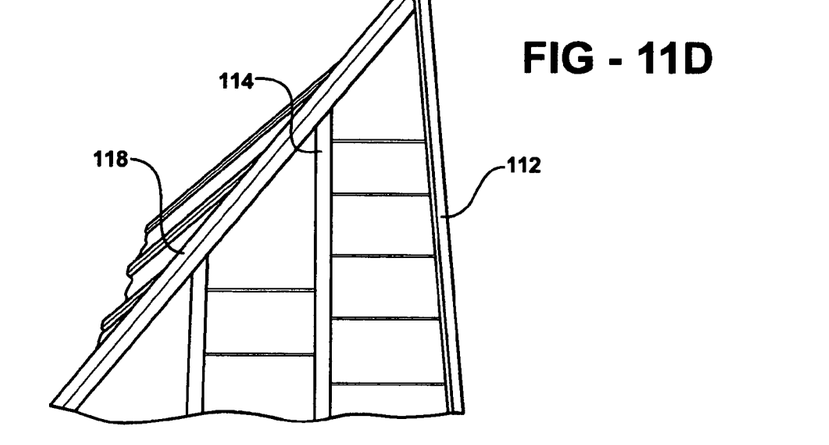
FIG. 11D is an illustration of a ridge having the web panels of FIGS. 11A and 11C secured with the engagement point formed over the ridge.
Figure 12A:
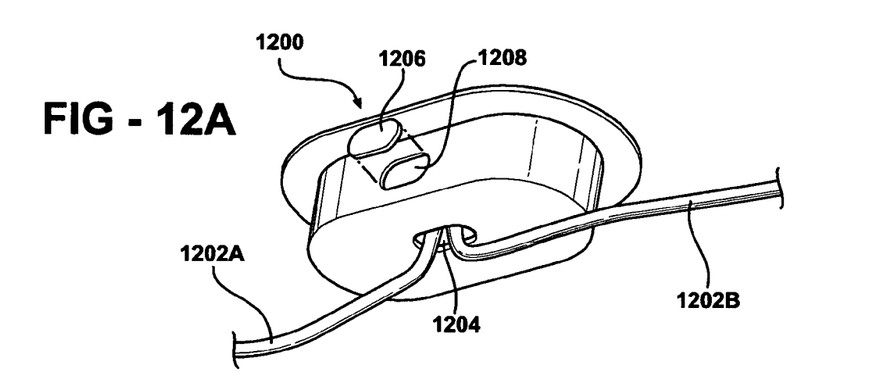
FIG. 12A is an illustration of a potted terminal cover having a top hole for cables and a side hole for epoxy injection.
Figure 12B:
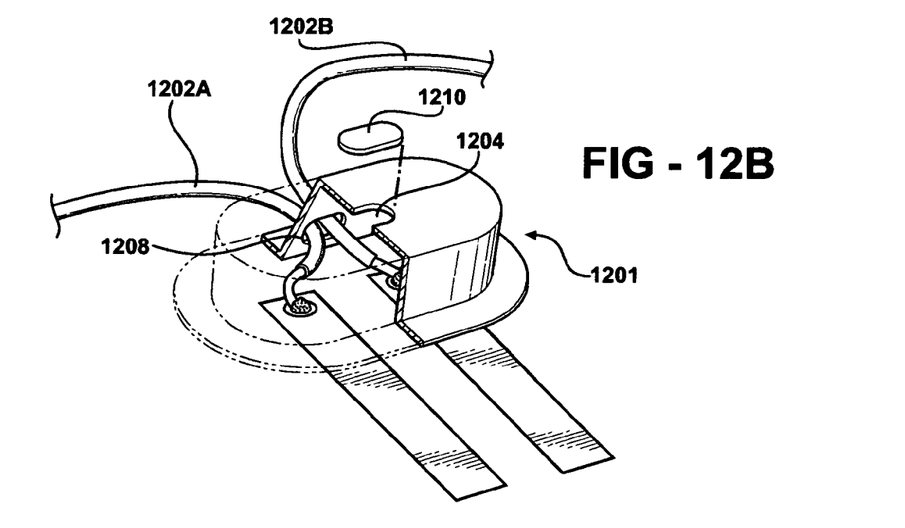
FIG. 12B is an illustration of a potted terminal cover having a side hole for cables and a top hole for epoxy injection.

Preferably, the photovoltaic strips are cut without damaging the photovoltaic active area. Referring to FIG. 11D, the photovoltaic strips 112 and 114 of FIGS. 11A and 11C are secured on a ridge as described above with a clamping strip (not shown), batten cap 118 and affixing mechanisms (not shown). The ridge is the approximate area where the engagement point of the photovoltaic strips is formed.

Referring again to FIGS. 11A through 11C, quick connect cables 1202A and 1202B are illustrated. At underside terminations, quick connects 1202A and 1202B exit the terminal cover through a top hole 1204 of the terminal cover 1200, as illustrated in 12A. Epoxy is injected through the side hole 1208 and the side hole cap 1206 is replaced. At top side terminations, quick connect cables 1202A and 1202B exit the terminal through the side hole 1208 of the terminal cover 1201, as illustrated in 12B. Epoxy is injected through the top side hole 1204 and the top side hole cap 1210 is replaced.

The batten cap 34 may be fabricated from any resilient material such as metals or polymers. Specifically preferred materials include high strength engineering polymers such as nylons, ABS and the like. Likewise, metal such as aluminum, iron, stainless steel or steel may be similarly employed. Similarly, the clamping strip 32 may be fabricated from any resilient material such as metals or polymers. Specifically preferred materials include high strength engineering polymers such as nylons, ABS and the like. Likewise, metal such as aluminum, iron, stainless steel or steel may be similarly employed.

Figure 5:
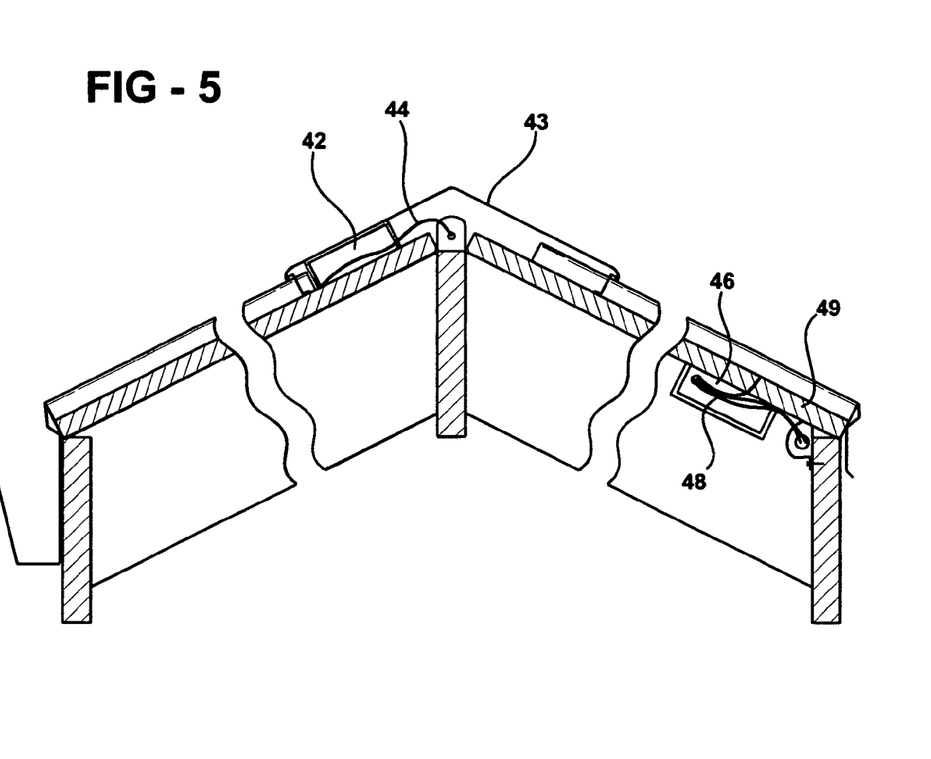
FIG. 5 is a depiction of portions of a flexible photovoltaic material being secured with clamping strips and batten caps to a roof deck according to the present invention and additionally, electrical components are illustrated.

Electrical components may be incorporated, as illustrated in FIG. 5. Electrical components include components such as a junction box 42 arrayed on the first peaked side and enclosed by a ridge cap 43, as well as a wire chase 44 extending from the junction box 42 and extending in a direction along the top ridge. In this fashion, the associated electrical connections, or terminals, of the succeeding plurality of photovoltaic strips may be communicated to the wire chase 44 and junction box 42. Additional components illustrated in FIG. 5 include an additional junction box 46 located on an underside face of the second peaked side of the roof deck 49. A series of wires 48 extend from the junction box 46, through holes drilled in the peaked side of the root deck 49, and typically exit from a bottom facing side of the laminate material associated with the top installed photovoltaic elements. Additional wires associated with the junction box 46 extend through a wire chase and such as in order to route the generated electrical load to a suitable output location. The capability of achieving such edge termination eliminates labor and structural problems inherent with smaller area devices.

As previously described, the preferred material for use in the present invention is a photovoltaic roofing material based upon flexible, large area, thin film photovoltaic devices which are laminated between environmentally resistant polymeric sheets. This type of material readily lends itself to being shipped and handled in a roll form and, referring further to FIG. 7A, a depiction is given of a form of roll packaging which may be used in connection with such materials.

Figure 7A:
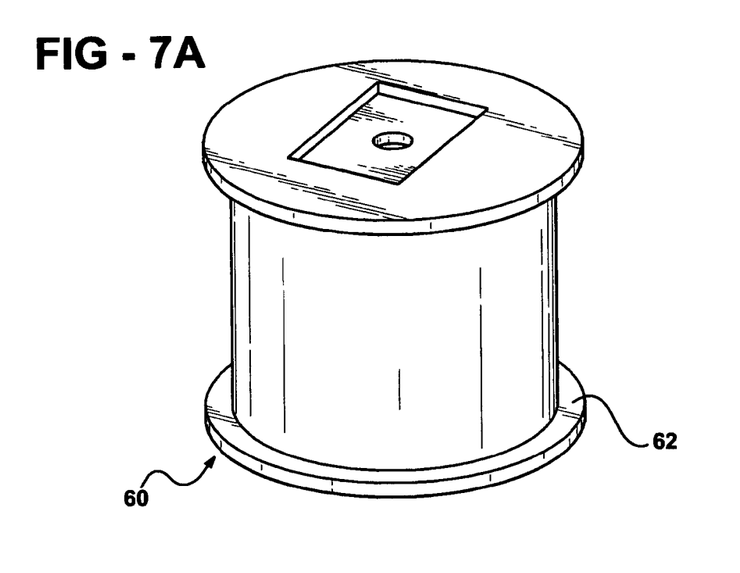
FIG. 7A is an illustration of a transport and storage spool for use in one embodiment with the photovoltaic material of the present invention.

An elongated roll of photovoltaic material may be rolled onto a relatively large core reel or spool 60 having a central annular and recessed surface and annularly enlarged and opposite extending ends 62 and which allows the reel to be rolled across a surface without harm to the photovoltaic material retained thereupon.

The size and configuration of the spool prevents undue bending or kinking of the photovoltaic material as it is wound thereupon and a recessed area defined in a top surface of the spool functions to protect shipping labels, as well as to hold instruction manuals and the like.

Figure 7B:
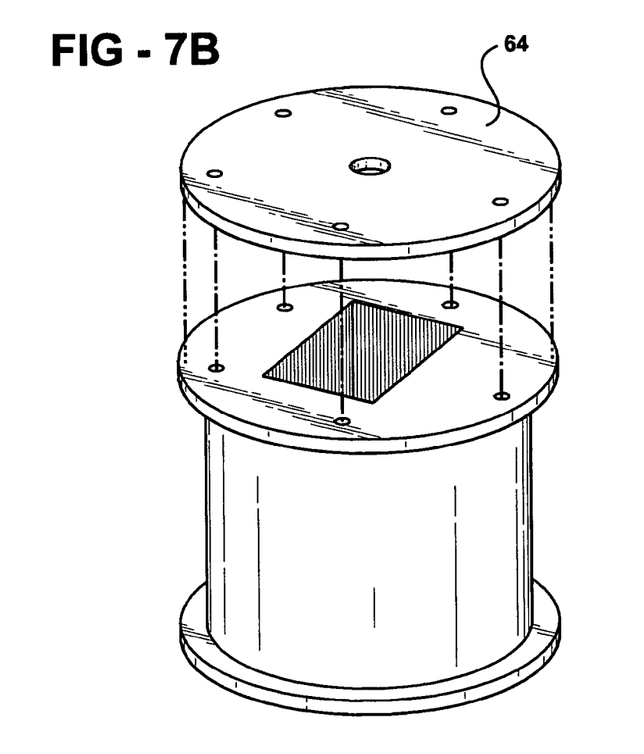
FIG. 7B shows the transport and storage spool of FIG. 7A, with an associated and removable cover in partially exploded fashion, and which reveals and interior storage compartment for holding such as assembly tools and other devices necessary for installing the photovoltaic material.
Figure 8:
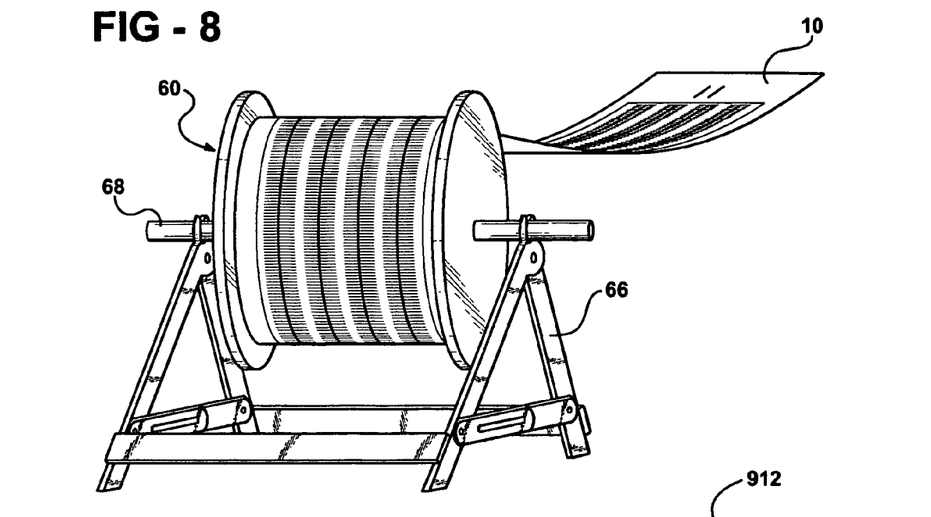
FIG. 8 is an illustration of a reel stand for dispensing the photovoltaic material from the transport and storage spool of FIGS. 7A and 7B and according to the present invention.

Referring further to FIG. 7B, a variation is shown of the spool design otherwise shown in FIG. 7A and which further illustrates an associated and removable cover 64, and which is typically shaped in a suitable annular manner to conform to the outline of the top surface of the spool. Aligning apertures defined between the cover and top surface receive mounting fasteners (not shown) and, upon removal of the same, the cover may be detached to reveal a suitable and geometrically defined aperture defined within the interior core of the spool and which provides interior storage for junction boxes, installation hardware, operational manuals, installation manuals and the like. As depicted in FIG. 8, an overall length of photovoltaic material contained within the reel or spool 60 may be mounted onto a stand or cradle 66. The spool is rotatably supported by an axle 68 and to permit the ready deployment of photovoltaic material 10 therefrom. Although not specifically shown, the reel of photovoltaic material may be serrated or broken at given distance increments and in order to facilitate sectioning from the spool. Along these lines, the arrangement of the photovoltaic areas and location of the contact terminals may be taken into consideration in the design of the reel and in order to provide efficient sectioning of given lengths of photovoltaic material during installation.

Figure 9A:
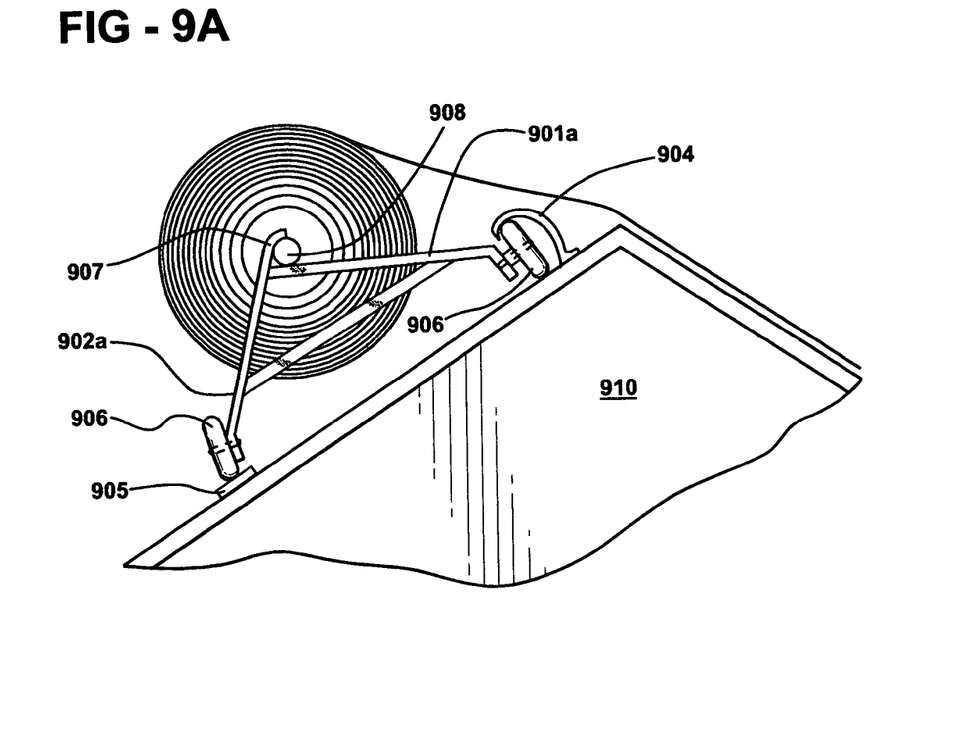
FIG. 9A is an illustration of an embodiment of a ridge-mounted spool stand for supporting a dispensing a spool during unreeling and affixing of photovoltaic material upon a roof.

The present invention discloses a ridge-mounted ridge roller, an embodiment of which, generally referred to as 900, for installing photovoltaic strips onto a roof, as illustrated in FIG. 9A. The photovoltaic strips are dispensed onto a roof from a spool, such as the spool described above. The ridge roller 900 secures a spool in a stable position on the ridge 910 and allows photovoltaic material to be installed onto a roof. Additionally, the ridge roller 900 may be set on rails 904 and 905 to smoothly transfer the spool along. By securing the spool on a ridge 910, the ridge roller 900 uses gravity to unroll the photovoltaic strips at a downward angle to a desired length. Preferably, the photovoltaic strips are cut specifically for the design of a particular roof to maximize the coverage of active photovoltaic material in a position to absorb solar power. The photovoltaic strips may be rolled onto the spool in the reverse order in which the strips will be unrolled onto the roof.

The ridge roller 900 may be supported by two sets of legs 901a, 901b, 902a and 902b (legs 901b and 902b not shown) adapted to run on rails 904 and 905. The rails 904 and 905 are mounted onto the roof, preferably over the ridge 910 on the side opposite the area to be covered by the photovoltaic strips. First rail 904 is secured along the ridge 910 and the second rail 905 is secured approcimately parallel to the first rail 904.

A wide variety of known methods may secure the rails 904 and 905 to the roof including but not limited to nails, screws, adhesives or clamps. Preferably the rails 904 and 905 are spaced a distance approximately equal to the distance between the two sets of legs 901a, 901b, 902a and 902b, because the first rail 904 provides a track for the first set of legs 901a and 901b and second rail 905 provides a track for the second set of legs 902a and 902b. The first rail 904 may be shaped in an arced form, as illustrated, to hold the first set of legs 901a and 901b on the first rail 904. The second rail 905 may have a flat surface, as illustrated. Preferably, each leg 901a, 901b, 902a and 902b is adapted to roll along the respective rail using wheels, bearings, or other rolling device. For illustrative purposes, wheel rollers 906 are depicted in FIG. 9A. Additionally, the rolling device may be locked with a locking device to hold the ridge roller 900 in a desired position. It should be apparent to one skilled in the art that other rolling devices and rails may be utilized without departing from the scope of the invention.

The ridge roller may include a cradle 907 to rotatably support the spool 908 of photovoltaic material. The spool 908 is set into the cradle 907 and strips of photovoltaic material may be drawn from the spool 908 in discreet lengths then cut for installation as described previously.

Figure 9B:
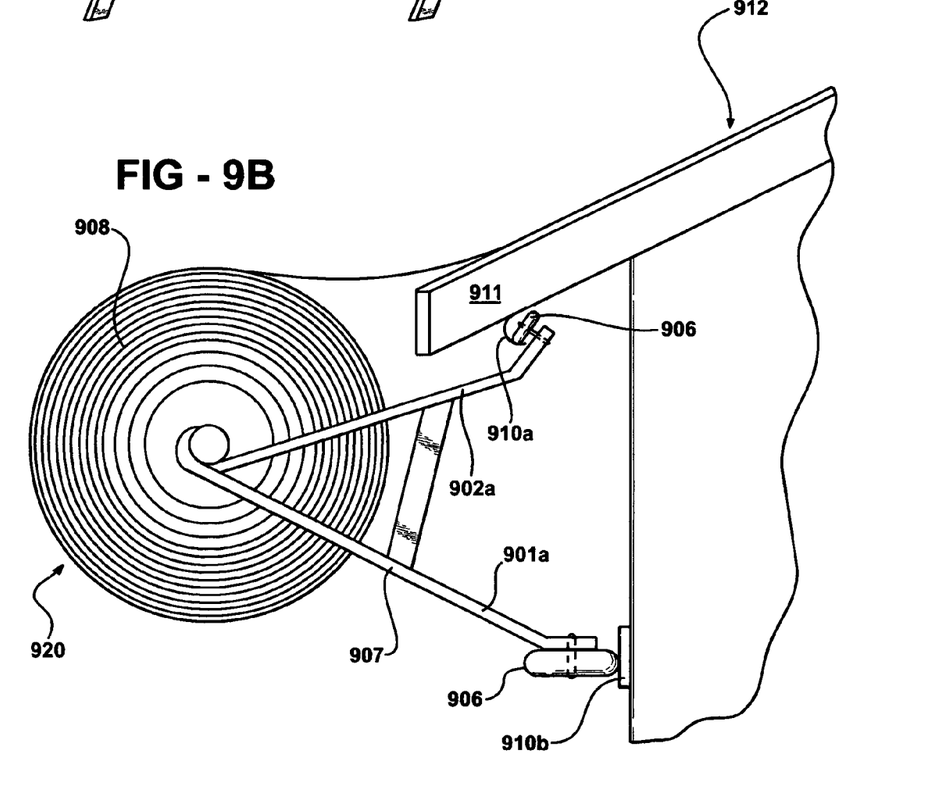
FIG. 9B is an illustration of an embodiment of an eave-mounted spool stand for supporting a dispensing a spool during unreeling and affixing of photovoltaic material upon a roof.

In an alternative embodiment, the stand or cradle 907 can be modified for supporting the spool 908 in lengthwise traversable fashion along a vertically extending eave edge 911 of a roof deck 912, as illustrated in FIG. 9B and described in U.S. patent application Ser. No. 10/095,391 filed on Mar. 12, 2002, which is hereby incorporated herein by reference. Angled legs 901a and 901b (leg 901b not shown) associated with a first side of the cradle 907, each terminate in a roller 906; whereas the other pair angled legs 902a and 902b (leg 902b not shown) each terminate in a further roller 906. Preferably, each leg 901a, 901b, 902a and 902b is adapted to roll along the respective rail using wheels, bearings, or other rolling device. For illustrative purposes, wheel rollers 906 are depicted in FIG. 9B. Rails 910a and 901b are positioned at underside rafter locations of the extending roof deck 912 so the rollers 906 engage the rails so that the eave roller 920 may move along the edge of the roof 912. As with the ridge roller, the eave roller 920 may be shifted to a desired location along the rails 910a and 901b, where measured lengths of the flexible photovoltaic material are unreeled and sectioned from the spool 908 and affixed directly onto the root 912. The eave roller 920 can then be moved to a another installation location. It should be apparent to one skilled in the art that the roller may be set into any of a number of positions to meet the needs of a particular roof design. Further, the rails may be positioned at different angles. Additionally, the respective rollers may be set on the rails in a variety of fashions, such as the incorporation of solid panels, rather than legs. Additional structures for both the ridge roller and the eave roller may include a cutting or knife edge incorporated into the trolley assembly, to facilitate sectioning of the lengths of photovoltaic material.

Figure 10A:
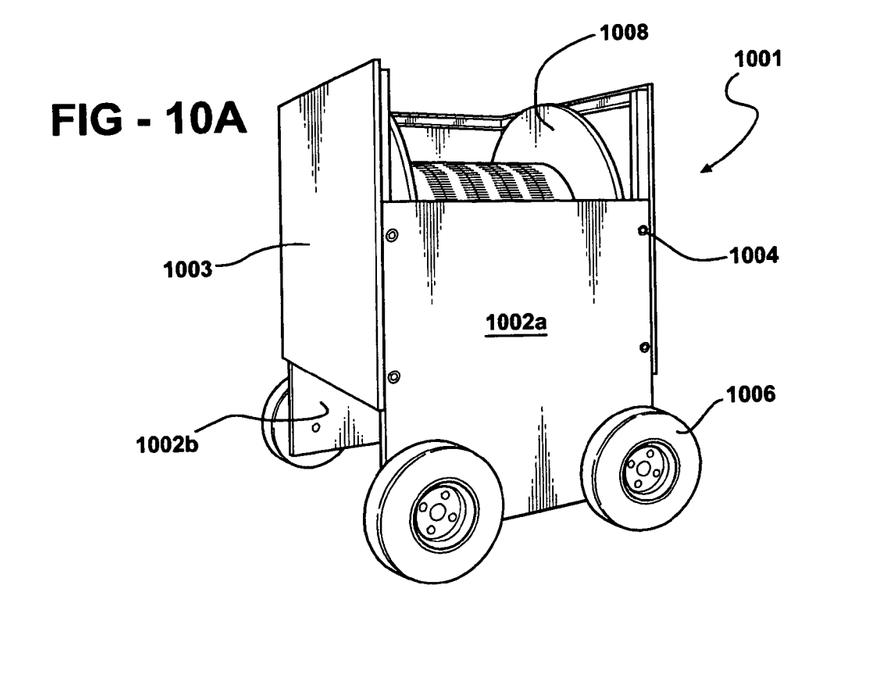
FIG. 10A is an illustration of an embodiment of a ridge-mounted spool container stand for transporting and supporting a dispensing a spool during unreeling and affixing of photovoltaic material upon a roof.
Figure 10B:
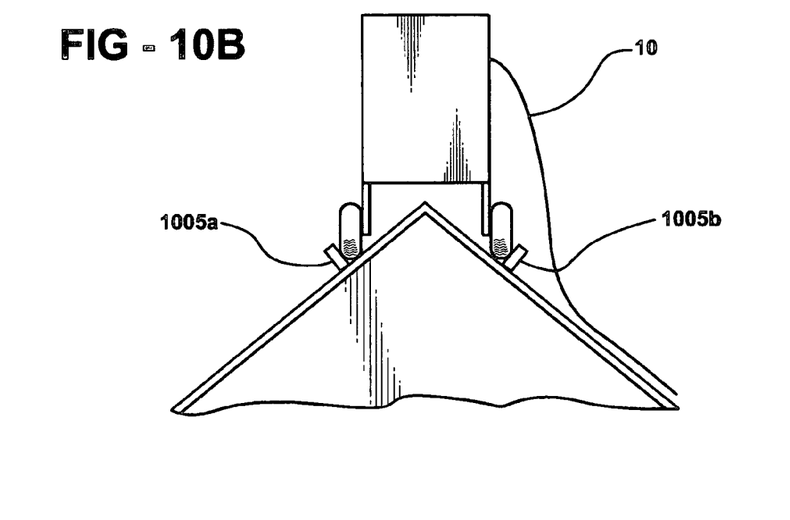
FIG. 10B is an illustration of an embodiment of a ridge-mounted spool container stand for transporting and supporting a dispensing a spool during unreeling and affixing of photovoltaic material upon a roof wherein the container stand in mounted on the ridge having uneven slopes.

An alternative design is illustrated in FIG. 10A and FIG. 10B. An embodiment of the ridge-mounted roller, generally referred to as 1001, includes a box shaped container 1003 for supporting the spool 1008 and wheels 1006 for providing movement along the ridge. Preferably, the wheels 1006 may be adapted to roll along either side of the ridge as illustrated. Preferably, guide rails 1005a and 1005b are provided to support and secure the position of the wheels 1006, however, the ridge roller 1001 does not require the use of guide rails. A spool 1008 may be rotatably secured in the container 1003 and transported. A rod (not shown) may be placed through the longitudinal center of the spool 1008 and secured in the container 1003, so that the photovoltaic strips may be unwound from the spool 1008 without removing the spool 1008 from the container 1003. For example, the spool 1008 may be manufactured with the appropriate lengths of photovoltaic strips for a roof, secured in a box with wheels and transported to the location of the roof. This embodiment of the ridge-roller 1001 may act as both a shipping container and a ridge-roller. The axles for wheel support may be secured to the appropriate location on the container sides. Other shapes of container, such as cylindrical or oval, may incorporated, although the box shape is preferred. The side walls 1002a and 1002b (not shown) having the wheels 1006 attached thereto of the box design may be adapted to slide with respect to the other two walls, which support the rod. Sliding walls 1002a and 1002b may be locked into a desired position by any securing mechanism, such as a wing nut 1004. This embodiment enables the wheels 1006 to be positioned in at different lengths to be adapted to varying roof designs. Further, the sliding walls 1002a and 1002b enable the wheels to be positioned on a ridge that is not precisely symmetrical.

While the invention has been illustrated in detail in the drawings and the foregoing description, the same is to be considered as illustrative and not restrictive in character as the present invention and the concepts herein may be applied to any flexible roofing material in need of securing. It will be apparent to those skilled in the art that variations and modifications of the present invention can be made without departing from the scope or spirit of the invention. For example, the shape of the clamping strip and the shape of the batten cap can be varied without departing from the scope and spirit of the invention.

Likewise, other affixation members such as locking tabs, nails and adhesives may be utilized.

The materials used to construct the various elements used in the embodiments of the invention, such as the clamping strip, batten clamp and roofing material may be varied without departing from the intended scope of the invention. Further more, by using one or more of the embodiments described above in combination or separately, it is possible to lay very large area strips of photovoltaic roofing material having terminal connections at their ends. Thus, it is intended that the present invention cover all such modifications and variations of the invention, that come within the scope of the appended claims and their equivalents.

I claim:

1. A method of mounting a flexible photovoltaic material onto a surface, said method comprising the steps of:
   providing a first and a second elongated web of said flexible photovoltaic material;
   disposing said first and second elongated webs on the surface in a longitudinally aligned relationship with one another, wherein a first edge of said first elongated web abuts a first edge of said second elongated web to form a longitudinal engagement point;
   securing at least one clamping strip onto the longitudinal engagement point, said clamping strip adapted to secure the longitudinal engagement point in a stable position; and
   securing a batten cap over said clamping strip, said batten cap having a curved first surface and a curved second surface, said curved first surface of the batten cap contacting a complementary curved surface of said first elongated web, said curved second surface of the batten cap contacting a complementary curved surface of said second elongated web, wherein the batten cap urges the first and second elongated webs against each other at said longitudinal engagement point.

2. The method of claim 1, further comprising securing a plurality of batten caps and a plurality of clamping strips over said longitudinal engagement point.

3. The method of claim 1, wherein said surface that the flexible photovoltaic material is mounted onto comprises a roof deck.

4. The method of claim 1, further comprising disposing a membrane material onto said root deck prior to said disposing of first and second elongated webs.

5. The method of claim 3, further comprising the step of applying a sheet of membrane material between the roof deck and said first and second elongated webs of flexible photovoltaic material.

6. The method of claim 3, further comprising the step of establishing electrical communication to each of said elongated webs of flexible photovoltaic material.

7. The method of claim 6, further comprising the step of establishing electrical communication in a region of a soffit of the roof.

8. The method of claim 6, further comprising the step of establishing electrical connection in a region of a ridge of the roof.

9. The method of claim 6, further comprising the step of establishing electrical communication proximate a transverse extending edge of each of said elongated webs of flexible photovoltaic material.

10. The method of claim 1, wherein said longitudinal engagement point forms a substantially triangular shape having said surface as a base that the flexible photovoltaic material is mounted onto, said first edge of said first elongated web as a first side and said first edge of said second elongated web as a second side.

11. The method of claim 1, wherein said curved first surface of said batten cap has an arcuate shape configured to resiliently maintain contact with said complimentary curved surface of the first elongated web.

12. The method of claim 1, further comprising securing a portion of said first elongated web to said surface that the flexible photovoltaic material is mounted onto utilizing a securing means and securing a portion of said second elongated web to the surface utilizing a securing means.

13. A system for securing photovoltaic material onto a surface, comprising:
   a first flexible web of photovoltaic material and a second flexible web of photovoltaic material, said first and second flexible webs set onto the surface in a longitudinally aligned relationship with one another, wherein a first edge of said first flexible web abuts a first edge of said second flexible web to form a longitudinal engagement point;
   at least one clamping strip secured onto the longitudinal engagement point without utilizing a mechanical fastener, said clamping strip adapted to secure the longitudinal engagement point in a stable position; and
   a batten cap secured over said clamping strip, said batten cap having a curved first surface and a curved second surface, said curved first surface of the batten cap contacting a complementary curved surface of said first flexible web, said curved second surface of the batten cap contacting a complementary curved surface of said second flexible web, wherein the batten cap urges the first and second flexible webs against each other at the longitudinal engagement point.

14. The system of claim 13, wherein each of said first and second flexible webs comprises a generally central photovoltaic area encapsulated within a polymeric material, said polymeric material having both side and end extending edges beyond said photovoltaic area and a pair of contact terminals extending from a selected end of each of said flexible webs for establishing electrical communication with the photovoltaic area.

15. The system of claim 13, wherein said longitudinal engagement point forms a substantially triangular shape having said surface as a base that the photovoltaic material is mounted onto, said first edge of said first flexible web as a first side and said first edge of said second flexible web as a second side.

16. The system of claim 13, wherein said clamping strip is fabricated from a material selected from the group consisting of aluminum, iron, steel, stainless steel, nylons or polystyrene.

17. The system of claim 13, wherein said batten cap is fabricated from a material selected from the group consisting of aluminum, iron, steel, stainless steel, nylons or polystyrene.

18. The system of claim 14, wherein each of said first and second flexible webs has a substantially uniform thickness throughout cross sections having said photovoltaic area, said uniform thickness tapering to a thinner thickness at said edges and sides of said polymeric material.

19. The system of claim 13, wherein said curved first surface of batten cap has an arcuate shape configured to resiliently maintain contact with said complimentary curved surface of the first flexible web.

20. The system of claim 13, further comprising a portion of said first flexible web secured to said surface that the photovoltaic material is mounted onto utilizing a securing means and a portion of said second flexible web to secured to the surface utilizing a securing means.

21. The system of claim 20, wherein said means for securing is selected from the group consisting of screws, nails and adhesive.

22. The system of claim 13, further comprising a ridge roller configured to rotatably secure a spool of photovoltaic material to facilitate the drawing and sectioning of discreet lengths of photovoltaic material, at least one of said first flexible web of photovoltaic material and said second flexible web of photovoltaic material supplied by said spool.

23. The system of claim 22, wherein said ridge roller comprises a first set of legs adapted to run along a first rail;

a second set of legs adapted to run along a second rail, said second rail approximately parallel to said first rail; and a cradle adapted to rotatably support said spool.

24. The system of claim 22, wherein said ridge roller comprises a first sliding panel having a first set of wheels; a second sliding panel having a second set of wheels; at least one first locking means, said first locking means adapted to lock said first sliding panel into a desired position; and at least one second locking means, said second locking means adapted to lock said second sliding panel into a desired position.

25. The system of claim 24, wherein said first set of wheels is adapted to run along a first rail and a second set of wheels adapted to run along a second rail, said second rail approximately parallel to said first rail.

\* \* \* \* \*